(12) United States Patent
Ono (10) Patent No.: US 7,757,136 B2
(45) Date of Patent: Jul. 13, 2010

(54) TESTING SYSTEM, TESTING SYSTEM CONTROL METHOD, AND TEST APPARATUS

(75) Inventor: Haruyoshi Ono, Nakakoma-gun (JP)

(73) Assignee: Eudyna Devices Inc., Yamanashi (JP)

( * ) Notice: Subject to any disclaimer, the term of this patent is extended or adjusted under 35 U.S.C. 154(b) by 678 days.

(21) Appl. No.: 11/730,247

(22) Filed: Mar. 30, 2007

(65) Prior Publication Data

US 2007/0245187 A1    Oct. 18, 2007

(30) Foreign Application Priority Data

Mar. 31, 2006    (JP)    ............................. 2006-101120

(51) Int. Cl.
 *G01R 31/28*    (2006.01)
(52) U.S. Cl. .................................................... 714/724
(58) Field of Classification Search ................. 714/724, 714/733
 See application file for complete search history.

(56) References Cited

U.S. PATENT DOCUMENTS

| | | | | |
|---|---|---|---|---|
| 6,078,183 A | * | 6/2000 | Cole, Jr. ...................... | 324/752 |
| 6,157,200 A | * | 12/2000 | Okayasu ...................... | 324/753 |
| 6,259,256 B1 | * | 7/2001 | Walling ....................... | 324/539 |
| 6,407,560 B1 | * | 6/2002 | Walraven et al. ............. | 324/752 |
| 6,996,757 B2 | * | 2/2006 | Evans .......................... | 714/724 |
| 7,263,286 B2 | * | 8/2007 | Peng ............................ | 398/22 |
| 7,362,089 B2 | * | 4/2008 | Kushnick et al. ......... | 324/158.1 |
| 2007/0208985 A1 | * | 9/2007 | Reichert et al. .............. | 714/742 |

FOREIGN PATENT DOCUMENTS

| | | |
|---|---|---|
| JP | 10-68753 A | 3/1998 |
| JP | 2005-341424 A | 12/2005 |

OTHER PUBLICATIONS

Japanese Office Action dated Sep. 29, 2009, issued in corresponding European Patent Application No. 2006-101120.

* cited by examiner

*Primary Examiner*—James C Kerveros
(74) *Attorney, Agent, or Firm*—Westerman, Hattori, Daniels & Adrian, LLP (57) ABSTRACT

A testing system includes a plurality of test applying portions and a plurality of testing portions, each test applying portion having a test device that generates an output signal and each testing portion tests the output signal of the test device, in response to the test applying portion. The testing system further includes a switch portion that switches the output signal of the test device between the test applying portions and the testing portions. The test applying portion has a selecting portion that selects the testing portion through the switch portion for testing the output signal according to test item information, the test item information including information about a test capability of the testing portion.

14 Claims, 9 Drawing Sheets

TEST ITEM LIST

| ORDER | TEST ITEM |
|---|---|
| 1 | TEST ITEM 1 |
| 2 | TEST ITEM 2 |
| 3 | TEST ITEM 3 |
| ⋮ | ⋮ |

TEST ITEM INFORMATION

TESTING PORTION a

TESTING PORTION b

TESTING PORTION c

FIG. 8

TEST ORDER INFORMATION

TESTING PORTION a

| ORDER | TEST APPLYING PORTION | TEST ITEM |
|---|---|---|
| 1 | B | 1 |
| 2 | C | 1 |
| 3 | — | — |
| ⋮ | ⋮ | ⋮ |

TESTING PORTION b

| ORDER | TEST APPLYING PORTION | TEST ITEM |
|---|---|---|
| 1 | C | 4 |
| 2 | — | — |
| 3 | — | — |
| ⋮ | ⋮ | ⋮ |

FIG. 9

TESTING PORTION b

| ORDER | TEST APPLYING PORTION | TEST ITEM |
|---|---|---|
| 1 | C | 4 |
| 2 | A | 1 |
| 3 | — | — |
| ⋮ | ⋮ | ⋮ |

FIG. 10A

| ORDER | TEST APPLYING PORTION | TEST ITEM | TEST PRIORITY INFORMATION |
|---|---|---|---|
| 1 | A | 1 | HIGH PRIORITY |
| 2 | C | 4 | NORMAL |
| 3 | — | — | — |
| ⋮ | ⋮ | ⋮ | ⋮ |

FIG. 10B

| ORDER | TEST APPLYING PORTION | TEST ITEM | TEST PRIORITY INFORMATION |
|---|---|---|---|
| 1 | C | 4 | HIGH PRIORITY |
| 2 | A | 1 | HIGH PRIORITY |
| 3 | — | — | — |
| ⋮ | ⋮ | ⋮ | ⋮ |

TESTING SYSTEM, TESTING SYSTEM CONTROL METHOD, AND TEST APPARATUS

BACKGROUND OF THE INVENTION

1. Field of the Invention

This invention generally relates to testing systems, testing system control methods, and test apparatuses, and more particularly, to a testing system, testing system control method, and test apparatus, by which multiple test devices or elements to be tested are tested with multiple test apparatuses.

2. Description of the Related Art

Testing the test devices or elements to be tested, such as light emitting devices that emit optical signals such as, for example, semiconductor lasers or the like or semiconductor devices that output electrical signals, is performed as described as follows. The power supply, signal generator, temperature controller, or the like applies voltage, current, signal, temperature, or the like on the test devices or elements such as, for example, the semiconductor lasers or semiconductor devices. The voltage, current, signal, temperature, or the like causes the test devices or elements to output test signals to be tested, such as the optical signals or electrical signals, respectively. A tester implements a test for a test item on the test device or element by use of the test signal to be tested. Hereinafter, a test applying portion includes: a power supply; a signal generator; a temperature controller; and a controller that controls them. A testing portion includes: a tester; and a controller that controls the tester.

As disclosed in Japanese Patent Application Publication No. 10-68753, electrical signals output from multiple test devices or elements are connected to multiple testers by a switch, and the testers implement tests by use of the electrical signals.

In such testing system, a program thereof has to be changed or the testing system has to be stopped, when a new tester is connected or the tester is disconnected. This prevents the effective use of the testers.

SUMMARY OF THE INVENTION

The present invention has been made in view of the above circumstances and provides a testing system, testing system control method, and a test apparatus, with which a testing portion can be connected or disconnected with ease without changing a program or stopping the whole system, when the testing portion is newly connected to or disconnected from the testing system.

According to one aspect of the present invention, there is provided a testing system including: a plurality of test applying portion that operate a test device to make an output signal from the test device; a plurality of testing portions that test the output of the test device; and a switch portion that switches the output signal between the test applying portions and the testing portions, the test applying portion having a selecting portion that selects the testing portion for testing the output signal through the switch portion under test item information, the test item information including information about a test capability of the testing portion.

According to another aspect of the present invention, there is provided a test applying portion that operates a test device to make an output signal of the test deice including: a selecting portion that selects a testing portion for testing the output signal under test item information, the test item information including information about a test capability of the testing portion.

According to yet another aspect of the present invention, there is provided a testing system control method including: receiving test item information including information about a test capability of testing portions; and selecting the testing portions for testing an output signal of a test device.

BRIEF DESCRIPTION OF THE DRAWINGS

Exemplary embodiments of the present invention will be described in detail with reference to the following drawings, wherein.

DESCRIPTION OF THE PREFERRED EMBODIMENTS

A description will now be given, with reference to the accompanying drawings, of exemplary embodiments of the present invention.

First Exemplary Embodiment

Figure 1:
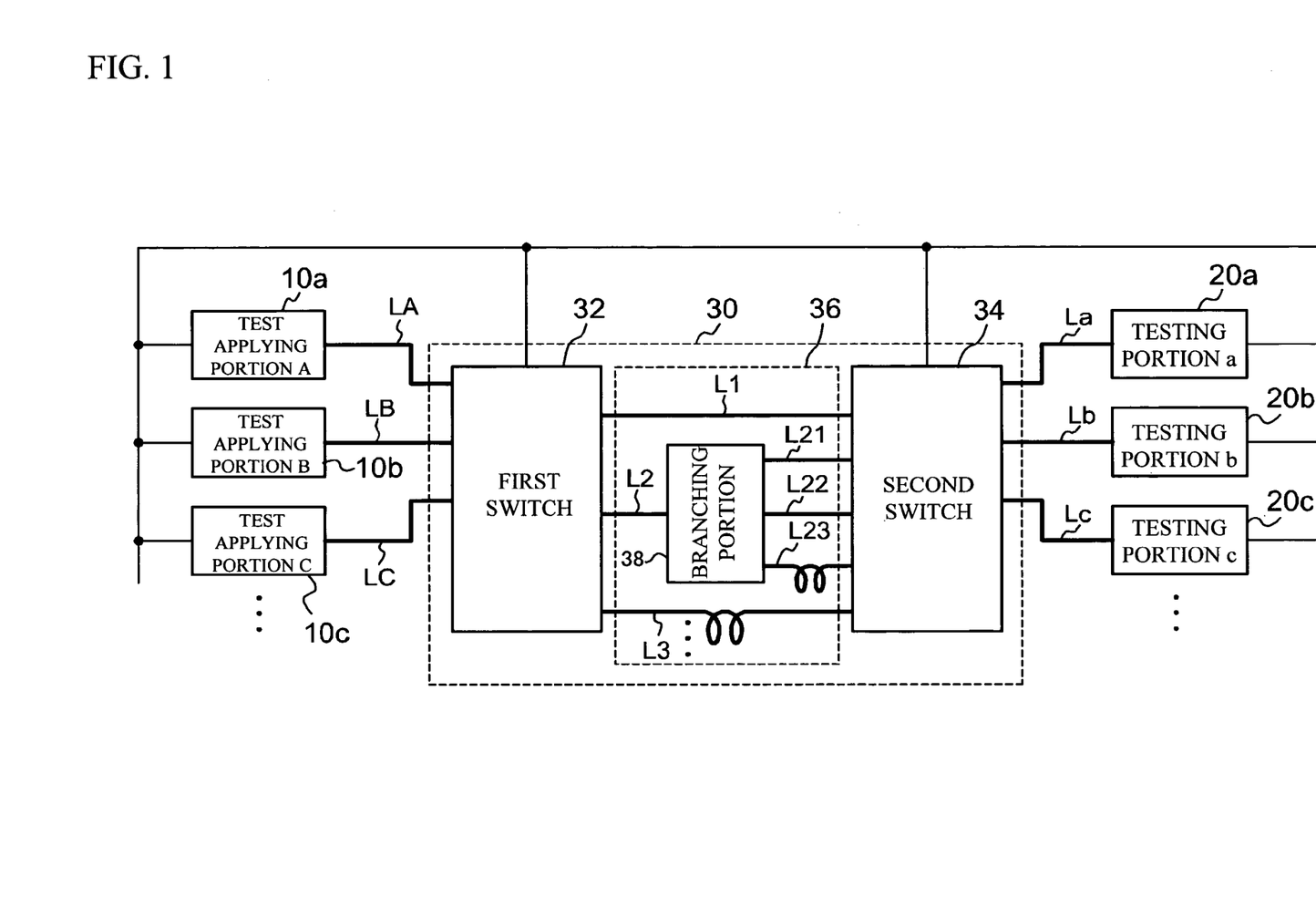
FIG. 1 shows a system configuration of a testing system in accordance with a first exemplary embodiment of the present invention.
Figure 2:
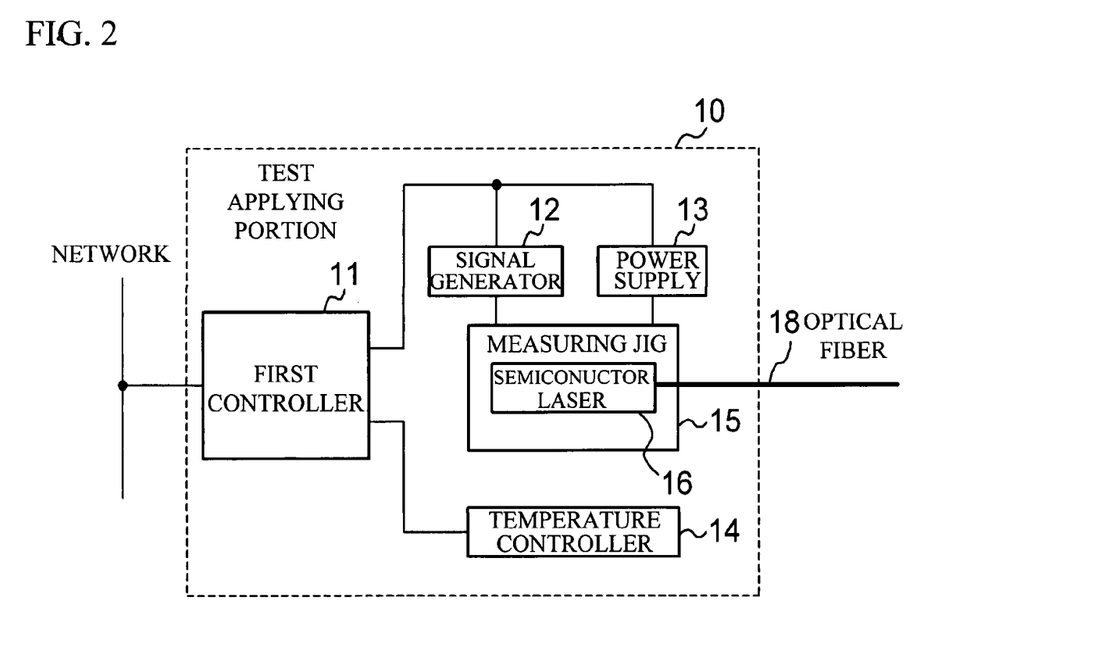
FIG. 2 is a block diagram of a test applying portion in accordance with the first exemplary embodiment of the present invention.

FIG. 1 shows a system configuration of a testing system in accordance with a first exemplary embodiment of the present invention. There are provided multiple test applying portions 10. FIG. 2 is a block diagram of the test applying portion 10. A semiconductor laser 16, which is a test device, is set at a measuring jig 15. A power supply 13 and a signal generator 12 are connected to the semiconductor laser 16. The power supply 13 outputs current and the signal generator 12 outputs an electrical signal, to the semiconductor laser 16. The semiconductor laser 16 outputs an optical signal, which is a signal to be tested, to an optical fiber 18. A temperature controller 14 controls the temperature of the semiconductor laser 16. A first controller 11 in the test applying portion 10 controls the signal generator 12, the power supply 13, and the temperature controller 14. The first controller 11 is made up, for example, of a personal computer, is connected to a network, and can be connected to or disconnected from the network without restarting an OA system. As stated, the test applying portion 10 includes: the first controller 11 serving as a testing portion selecting portion; the signal generator 12 that outputs an electrical signal to the corresponding semiconductor laser 16; the power supply 13; and the temperature controller 14 serving as a signal outputting portion.

Figure 3:
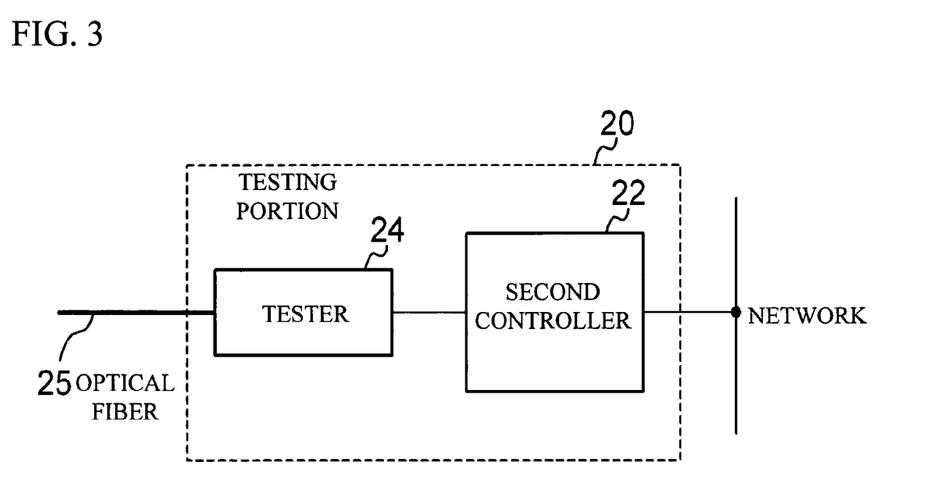
FIG. 3 is a block diagram of a testing portion in accordance with the first exemplary embodiment of the present invention.

In FIG. 1, there are provided multiple testing portions 20. FIG. 3 is a block diagram of the testing portion 20. An optical signal of the semiconductor laser 16 is input from an optical fiber 25. A tester 24 is made up, for example, of an optical power meter, optical oscilloscope, error bit measuring device, or the like, and performs a test for a test item of the semiconductor laser that corresponds to the test applying portion 10 by use of the optical signal. In this manner, the testing portion 20 performs a test for a test item of the test device or element by use of the signal output from the test device or element. A second controller 22 in the testing portion 20 is made up, for example, of a personal computer, is connected to a network, and can be connected to or disconnected from the network without restarting an OA system. As stated, the testing portion 20 includes: the tester 24, serving as a test performing portion, that performs a test for a test item required by the testing portion 20; and the second controller 22 serving as a test information portion. Here, the testing portion 20 may include multiple testers 24. In addition, the testing portion 20 may include a converter that converts the optical signal to the electrical signal such that the optical fiber 25 is connected to the converter and the electrical signal output from the converter is tested by the tester 24.

Referring back to FIG. 1 again, the signals to be tested respectively output from test applying portions 10a, 10b, and 10c respectively travel through transmission paths LA, LB, and LC, and are input into a switch portion 30. The signal output from the switch portion 30 respectively travel through transmission paths La, Lb, and Lc, and are respectively input into testing portions 20a(a), 20b(b), and 20c(c). The switch portion 30 is an optical switch, and arbitrarily connects the transmission paths LA, LB, and LC with the transmission paths La, Lb, and Lc. The switch portion 30 connects the signal output from at least one of the multiple test applying portions, namely, the signal output from at least one of the test devices or elements, with at least one of multiple testing portions 20. The switch portion 30 includes: a first switch 32 connected to the multiple test applying portions 10; and a second switch 34 connected to the multiple testing portions 20; and a connecting portion 36 that transmits the signal from the first switch 32 to the second switch 34. Here, matrix switches are employed for the first switch 32 and the second switch 34.

The first switch 32 arbitrarily connects the transmission paths LA, LB, and LC with the transmission paths L1, L2, and L3 of optical fibers in the connecting portion 36. The transmission path L1 is connected to the second switch 34. The transmission path L2 is connected to a branching portion 38 that branches the optical signals. The branching portion 38 is, for example, an optical coupler that branches the optical signals into transmission paths L21, L22, and L23 of optical fibers. The transmission path L23 has a longer transmission distance than those of the transmission paths L21 and L22. That is, the transmission distances are different. The transmission path having a long transmission distance is produced by forming the transmission path with the use of, for example, a long optical fiber. The transmission paths L21, L22, and L23 are connected to the second switch 34. The transmission path L3 has a longer transmission distance than the transmission path L1. The transmission L3 is connected to the second switch 34. The second switch 34 arbitrarily connects the transmission path L1, L21, L22, L23, and L3 with the transmission path La, Lb, and Lc of optical fibers. The transmission paths La, Lb, and Lc are respectively connected to the testing portions 20a(a), 20b(b), and 20c(c). The test applying portions 10, the testing portions 20, the first switch 32, the second switch 34 are respectively connected to a network such as a LAN or the like, the first switch 32 and the second switch 34 composing the switch portion 30.

As stated, the testing system employed in the first exemplary embodiment is provided with: the multiple test applying portions 10 that cause the semiconductor lasers 16 (test devices or elements) to emit optical signals; and the multiple testing portion 20 that perform tests for test items by use of the optical signal (signal to be tested) output from one of the multiple semiconductor lasers 16. In addition, the testing system further includes the switch portion 30 that connects an optical signal output from at least one of the multiple semiconductor lasers 16 to at least one of the multiple testing portions 20.

Figure 4:
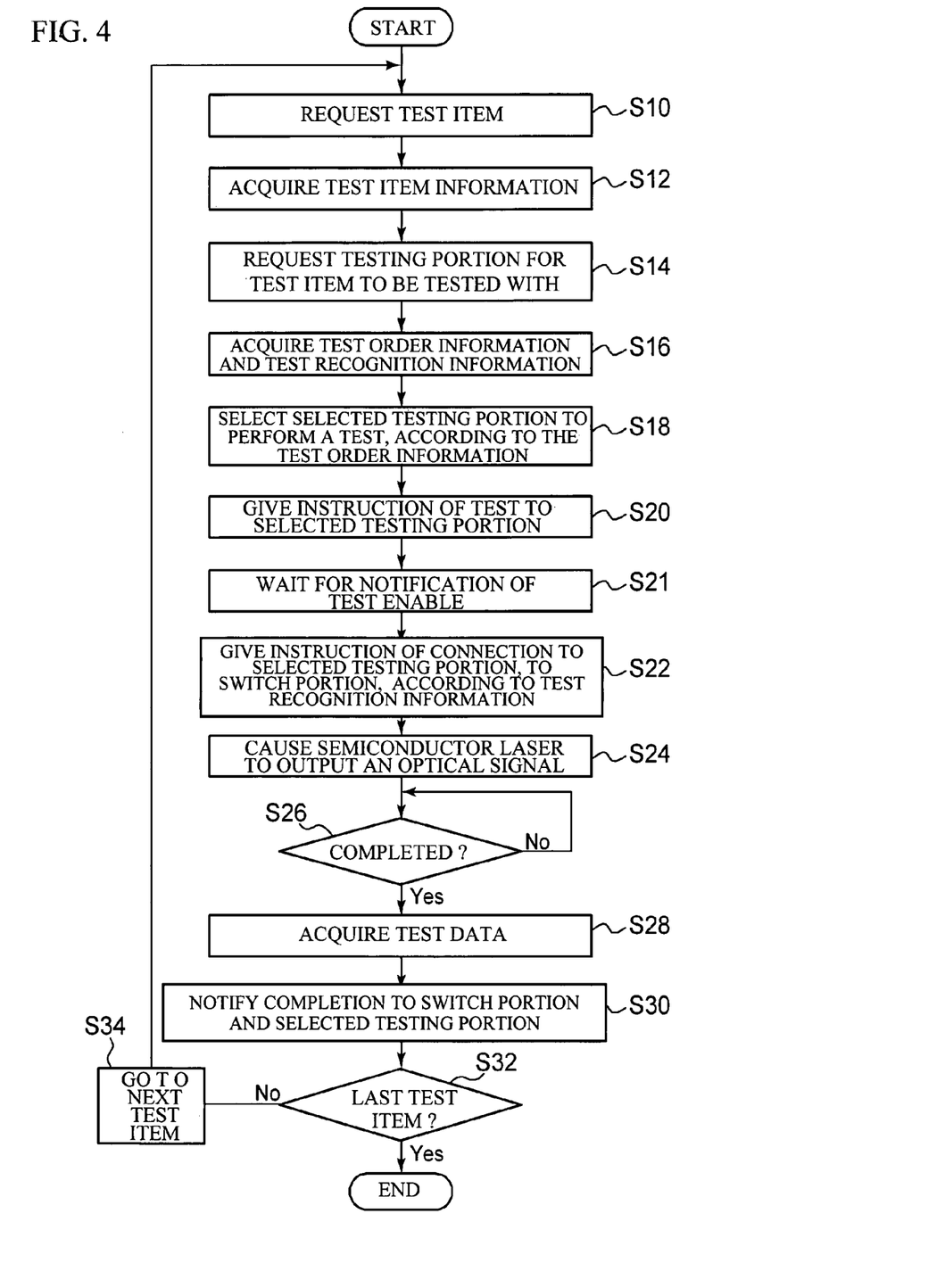
FIG. 4 shows a series of controls performed by the test applying portion in accordance with the first exemplary embodiment of the present invention.
Figure 5:
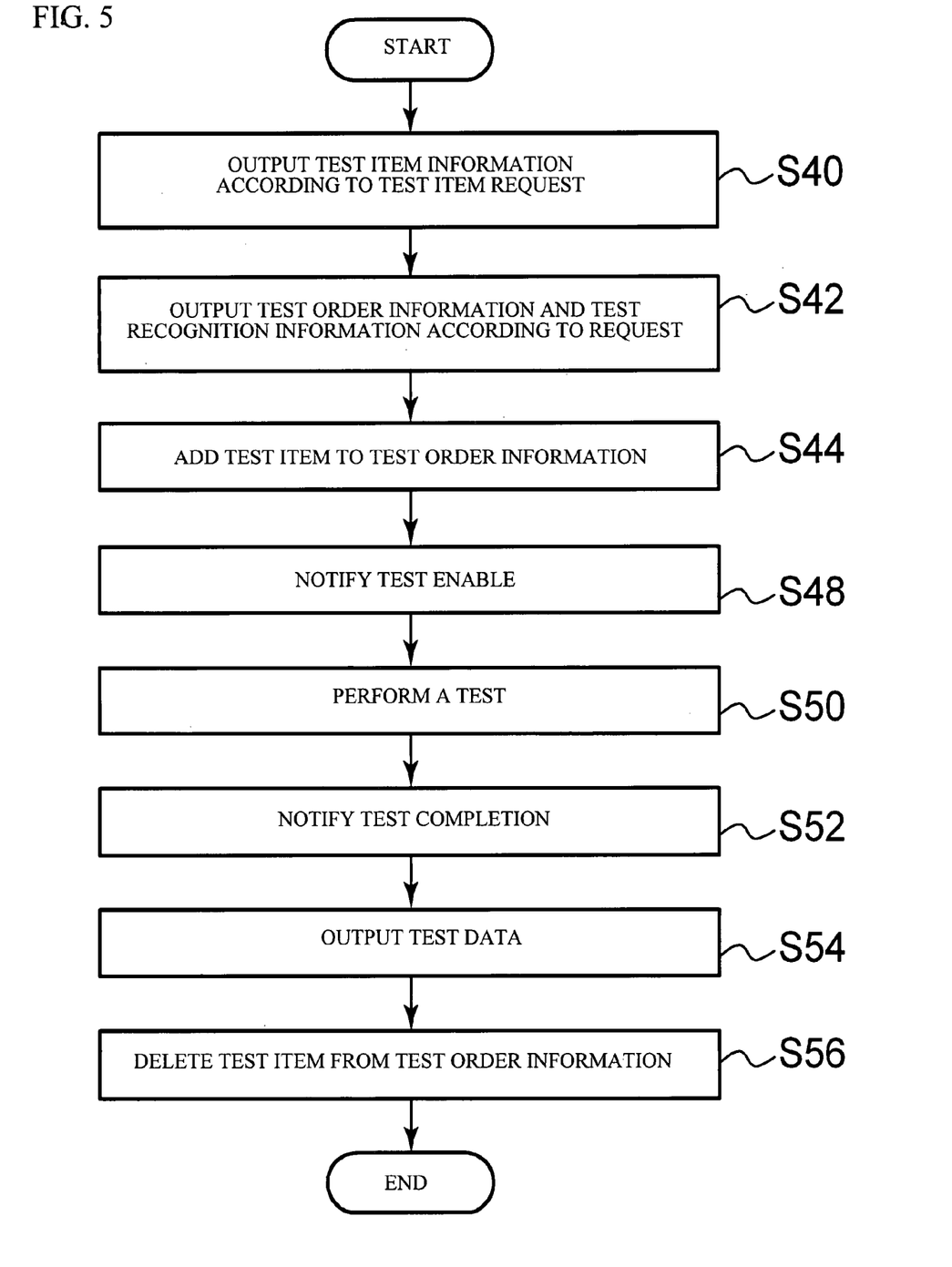
FIG. 5 shows a series of controls performed by the testing portion in accordance with the first exemplary embodiment of the present invention.
Figure 6A:
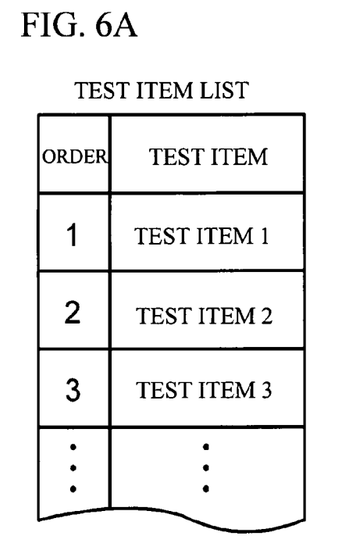
FIG. 6A shows an example of a list of test items in accordance with the first exemplary embodiment of the present invention.
Figure 6B:
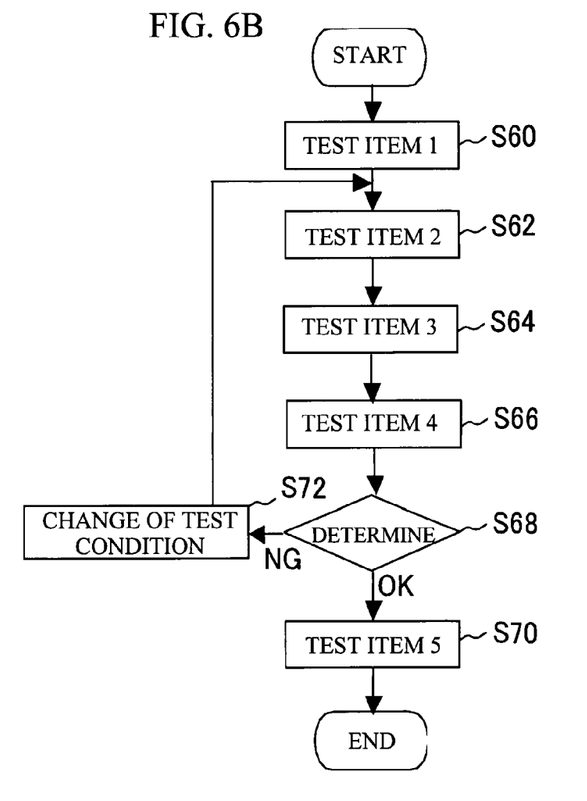
FIG. 6B is a flowchart of the tests to be performed by the test applying portion in accordance with the first exemplary embodiment of the present invention.

Referring to FIG. 4 and FIG. 5, a description will now be given of operations of the testing system employed in the first exemplary embodiment. A description will be given of a case where a test device or element of the test applying portion 10a(A) is tested. FIG. 4 shows a series of controls performed in the test applying portion 10a(A) (selected test applying portion), which is one of the multiple test applying portions 10. FIG. 5 shows a series of controls performed by the testing portion 20. The first controller 11 in the test applying portion 10a has a list of the test items. FIG. 6A shows an example of the list of the test items. In the list of the test items, there are listed test items 1, 2, and 3 corresponding to the order of the test. Also, the test applying portion 10a has a test flow as shown in, for example, FIG. 6B. According to the example of the test flow of FIG. 6B, the test item 1 through a test item 4 are performed (step S60 through S66). Next, it is determined that the test results of the test item 2 through the test item 4 satisfy a given reference (step S68). If the given reference is satisfied, a test for a test item 5 is performed (step S70) and the test result is stored and ended. At step S68, if the given reference is not satisfied, change a test condition performed by the testing portion 20, a condition of outputting an optical signal from the semiconductor laser 16, a test condition of a transmission path selected by the switch portion 30, or the like (step S72), and go back to step S62. In this manner, the test applying portion 10 may not only perform the test on the basis of the list of the test items but also perform the test again when the test condition is changed on the basis of the test result. In addition, the test item 1 through the test item 5 may be performed by an identical testing portion 20, or may be performed by different testing portions 20, respectively.

Figure 7:
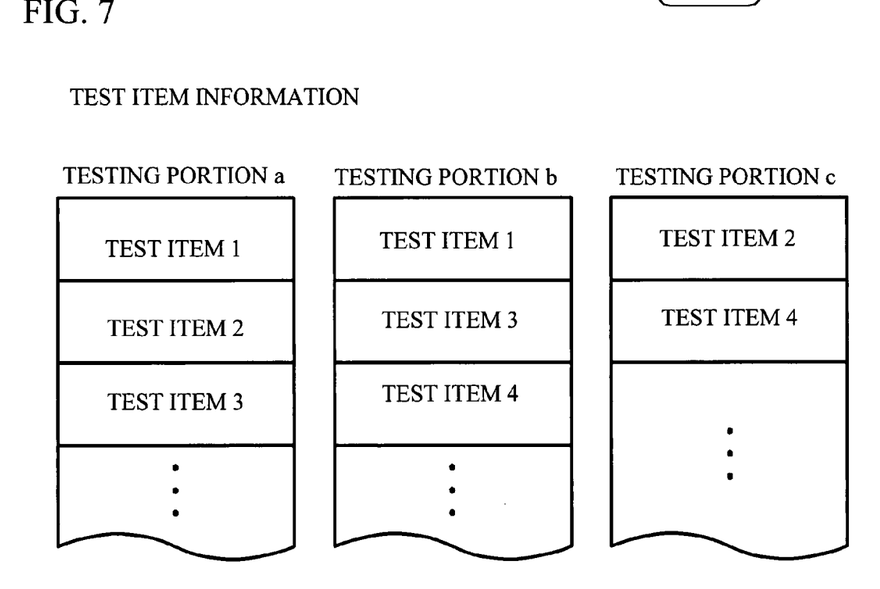
FIG. 7 shows examples of test item information of the testing portions in accordance with the first exemplary embodiment of the present invention.

Next, a description will be given of a flow when the test is performed with one test item. Referring now to FIG. 4, the first controller 11 requests the respective testing portions 20a, 20b, and 20c for test item information that includes a test item that can be tested (step S10). The second controller 22 in the testing portion 20 has a list of the test items that can be tested, as shown in FIG. 7. For example, a testing portion 20a is capable of performing tests for the test items 1, 2, and 3. A testing portion 20b is capable of performing tests for the test items 1, 3, and 4. A testing portion 20c is capable of performing tests for the test items 2 and 4. Referring to FIG. 5, the second controller 22 in the testing portion 20 outputs at least one test item that can be tested (test item information) to the first controller 11 in the test applying portion 10a, according to a test item request issued by the test applying portion 10a (step S40). Referring to FIG. 4, the first controller 11 in the test applying portion 10a acquires each piece of the test item information from the testing portions 20, respectively (step S12).

Figure 8:
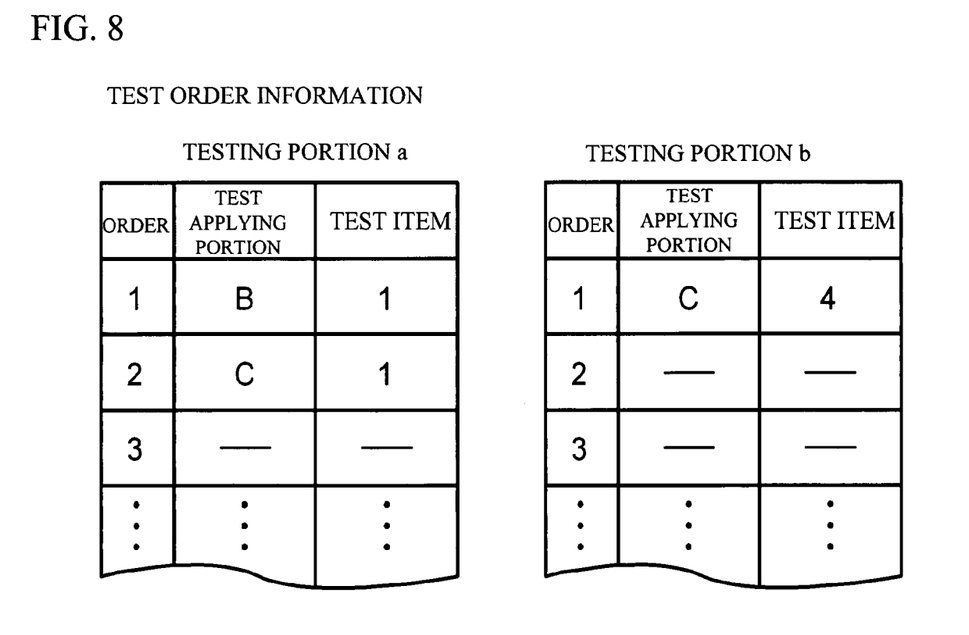
FIG. 8 shows examples of test order information of the testing portions in accordance with the first exemplary embodiment of the present invention.

Referring to FIG. 4, since the testing portion 20a and the testing portion 20b, among the testing portions 20, are capable of performing the test for the test item 1, the first controller 11 in the test applying portion 10a requests the testing portions 20a and 20b having the test item 1 that should be tested, for test order information or the like (step S14). The second controller 22 in the testing portion 20 has test order information related to the priority in the test. FIG. 8 shows and example of the test order information of the testing portion 20a and that of the testing portion 20b. The test order information includes: for example, the order of the tests to be performed; the test applying portions; and the test items. The testing portion 20a performs the test for the test item 1 of the test applying portion 10b(B) as a next test, and then performs the test for the test item 1 of the test applying portion 10c(C). The testing portion 20b performs a test for the test item 4 of the test applying portion 10c. Referring to FIG. 5, the second controller 22 in the testing portion 20a and that in the testing portion 20b output the test order information to the first controller 11 in the test applying portion 10a (step S42). At this time, the first controller 11 in the test applying portion 10a may output test recognition information to cause the switch portion 30 to connect an optical signal to a tester and test operation information that shows an operating condition of the test in the testing portion 20, or the like, to the first controller 11 in the test applying portion 10a. Also, the test recognition information and the test operation information may be output to the test applying portion 10a at another timing different from the test order information. Referring to FIG. 4 again, the first controller 11 in the test applying portion 10a acquires the test order information, the test recognition information, the test operation information, and the like, from the testing portion 20 (step S16).

Figure 9:
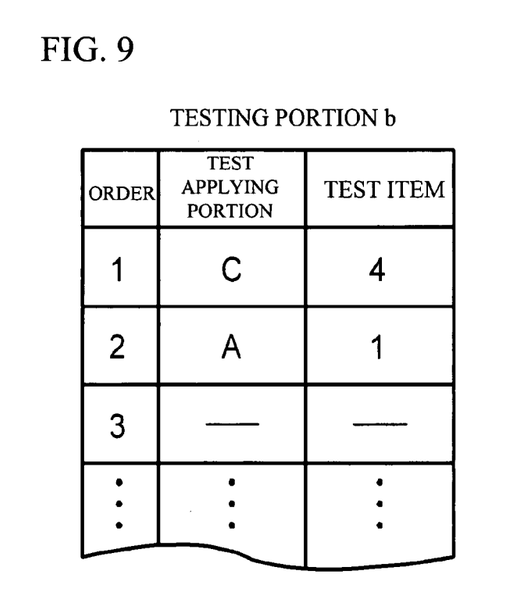
FIG. 9 shows another example of the test order information of the testing portions in accordance with the first exemplary embodiment of the present invention.

According to the test order information, the first controller 11 in the test applying portion 10a selects a testing portion, which is the testing portion 20 that is caused to perform the test for the test item 1 (step S18). For example, a test waiting order may be acquired as the test order information and the testing portion 20 having an earlier number may be selected. Also, a test waiting item may be acquired and a test time of the test item be considered, so that the selected testing portion may be selected. In the first exemplary embodiment, supposing that the testing portion 20b is selected. The first controller 11 in the test applying portion 10a gives an instruction of the test for the test item 1 to the testing portion 20b, which is a selected testing portion (step S20). The first controller 11 in the test applying portion 10a waits for a notification of test enable from the testing portion 20b (step S21). Referring to FIG. 5, on receiving the instruction from the test applying portion 10a, the second controller 22 in the testing portion 20b adds the test item 1 of the test applying portion 10a to the test order information (step S44), as shown in FIG. 9.

When the test for the test item 1 in the test applying portion 10a is enabled, the test enable is notified to the test applying portion 10a (step S48). Referring to FIG. 4 again, the first controller in the test applying portion 10a gives an instruction of connecting the transmission path LA, which propagates the optical signal output from the test applying portion 10a, with the transmission path Lb that corresponds to the selected testing portion 20b (step S22). The first controller 11 in the test applying portion 10a gives an instruction to the signal generator 12, the power supply 13, and the temperature controller 14 to output the optical signal, which is a signal to be tested, from to the semiconductor laser 16, which is a test device or element (step S24). The first controller 11 in the test applying portion 10a waits for the completion of the test (step S26). Referring to FIG. 5 again, the tester 24 of the testing portion 20b performs the test for the test item 1 by use of the optical signal output from the semiconductor laser 16 corresponding to the test applying portion 10a (step S50). The second controller 22 in the testing portion 20b notifies the completion of the test to the test applying portion 10a, when the test is completed (step S52). The second controller 22 in the testing portion 20b outputs test data of the test item 1 to the test applying portion 10a (step S54).

Referring to FIG. 4 again, the first controller 11 in the test applying portion 10a acquires the test data from the testing portion 20b (step S28). The first controller 11 in the test applying portion 10a confirms whether there is anything wrong with the test data, and if not, the first controller 11 in the test applying portion 10a notifies the completion of the test to the switch portion 30 and to the testing portion 20b (step S30). Referring to FIG. 5, on receiving the notification of the completion of the test, the second controller 22 in the testing portion 20b deletes the test item 1 in the test order information of the test applying portion 10a (step S56). Referring to FIG. 4 again, the first controller 11 in the test applying portion 10a determines whether or not it is the last test item on the basis of the test item list (step S32). If it is not the last test item, processing goes to the nest test item in the test item list in FIG. 6A (step S34). If it is the last test item at step S32, the test is completed.

In the test applying portion 10a, which is a test apparatus of the testing system used in the first exemplary embodiment, the first controller 11 in the test applying portion 10a (testing portion selecting portion) acquires the test item information that shows the test items of test enable, from at least a portion, for example, the testing portions 20a and 20b, among multiple testing portions 20. As in the step S18 of FIG. 4, the selected testing portion 20b, which is the testing portion 20 that performs the test for the test item to be tested, on the basis of the test item information. At step S22 of FIG. 4, an instruction is given to the switch portion 30 to couple the optical signal to the selected testing portion 20b. For example, the test applying portion 10a is newly connected, the first controller 11 in the test applying portion 10a does not have the information on which the testing portion 20 among the multiple testing portions 20 should perform a test for a given test item. In the aforementioned case, the test applying portion 10a is capable of acquiring the test item information of each of the testing portions 20 and selecting the testing portion 20, in accordance with the first exemplary embodiment of the present invention. This allows the test applying portion 10a to be newly connected to the testing system, without changing the program that gives an instruction of the testing portion 20 that performs the test for the test item, to the first controller 11. In addition, when the test applying portion 10a is disconnected from the testing system, there is no necessity of changing the program or stopping the system, for example, so as to cause the testing portion 20 to perform the test according to which the test applying portion 10 gives the instruction. This facilitates the connection or disconnection of the test applying portion 10 to or from the testing system. Furthermore, the selected testing portion can be selected from the multiple testing portions 20 connected to the network, thereby utilizing the multiple testing portions in an effective manner.

The first controller 11 may acquire the test item information that the testing portion 20 outputs on a regular basis, without outputting the test item request. However, in the first exemplary embodiment, at step S10 of FIG. 4, the first controller 11 outputs the test item request to acquire the test item information to the testing portions 20a and 20b. At step S12, the test item information is acquired from the testing portions 20a, 20b, and 20c to correspond to the test item request. This enables the test item information to be acquired effectively.

The first controller 11 in the test applying portion 10 may select the selected testing portion on the basis of the test item information, without acquiring the test order information. However, in the first exemplary embodiment, at step S16 of FIG. 4, the first controller 11 in the test applying portion 10 acquires the test order information related to the waiting order in which the testing portions 20a and 20b perform the test. At step S18 of FIG. 4, the first controller 11 in the test applying portion 10a selects the selected testing portion 20b to be connected, on the basis of the test order information of the testing portions 20a and 20b. This makes it possible to select the testing portion 20b that can perform the test early. Here, the test order information may be the information on the order of the test in which the testing portion 20 performs. For example, the test order information may be only the operation information that shows whether another test is being currently performed.

In the testing portion 20, which is the test apparatus of the testing system employed in the first exemplary embodiment, the second controller 22 (test information portion) in the testing portion 20 outputs the test item information, which is the test item that the second controller 22 can perform, to the selected test applying portion 10a, which is one of the multiple test applying portions 10, at step S40. At step S50, the tester 24 (test performing portion) performs the test on the optical signal output from the semiconductor laser 16 that corresponds to the selected test applying portion 10a and connected to the switch portion 30, by use of the test item requested by the selected test applying portion 10a, among the test items that can be tested. That is to say, the tester 24 performs the test on the optical signal output from the semiconductor laser 16 selected on the basis of the test item information, by use of the corresponding test item. For example, when the testing portion 20b is newly connected to the testing system, the second controller 22 in the testing portion 20b does not have the information on the test to be performed by use of which test item among the test items that can be tested. Even in the aforementioned case, the testing portion 20b is capable of outputting the test item information to the selected test applying portion 10a and performing the test by use of the test item requested by the selected test applying portion 10a. This allows a new testing portion 20b to be connected to the testing system, without changing the program that designates the test item by which the test is performed by the second controller 22 in the testing portion 20b. In addition, if the testing portion 20b is disconnected from the testing system, there is no necessity of changing the program or stopping the system of the test item information, for example, in the test applying portion 10. In this manner, the connection or disconnection of the testing portion 20 to or from is facilitated.

The second controller 22 may output the test item information to the selected testing portion on a regular basis. However, in the first exemplary embodiment, the second controller 22 in the testing portion 20 outputs the test item information according to the request issued by the selected test applying portion 10a at step S40 of FIG. 5. This makes it possible to output the test item information in an effective manner.

As shown in FIG. 8, the second controller 22 in the testing portion 20 has the test order information related to the order of the test to be performed. This enables the test items to be performed in order. Also, the test order information may be output to the test applying portion 10.

At step S42 of FIG. 5, the second controller 22 in the testing portion 20 outputs the test recognition information to connect the optical signal output from the semiconductor laser 16 corresponding to the selected test applying portion 10a, to the selected test applying portion 10a. This allows the second controller 22 in the testing portion 20 to connect the tester 24 that corresponds to the switch portion 30 with the optical signal output from the selected test applying portion 10a.

Figure 10A:
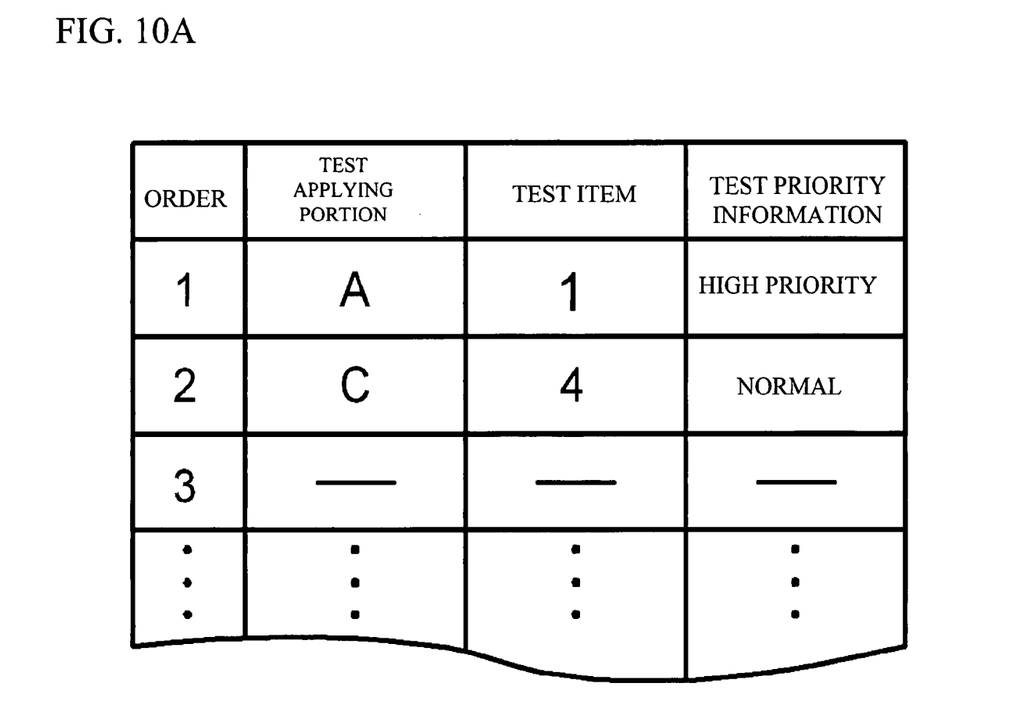
FIG. 10A and FIG. 10B are examples in which the test order information includes test priority information in accordance with the first exemplary embodiment of the present invention.
Figure 10B:
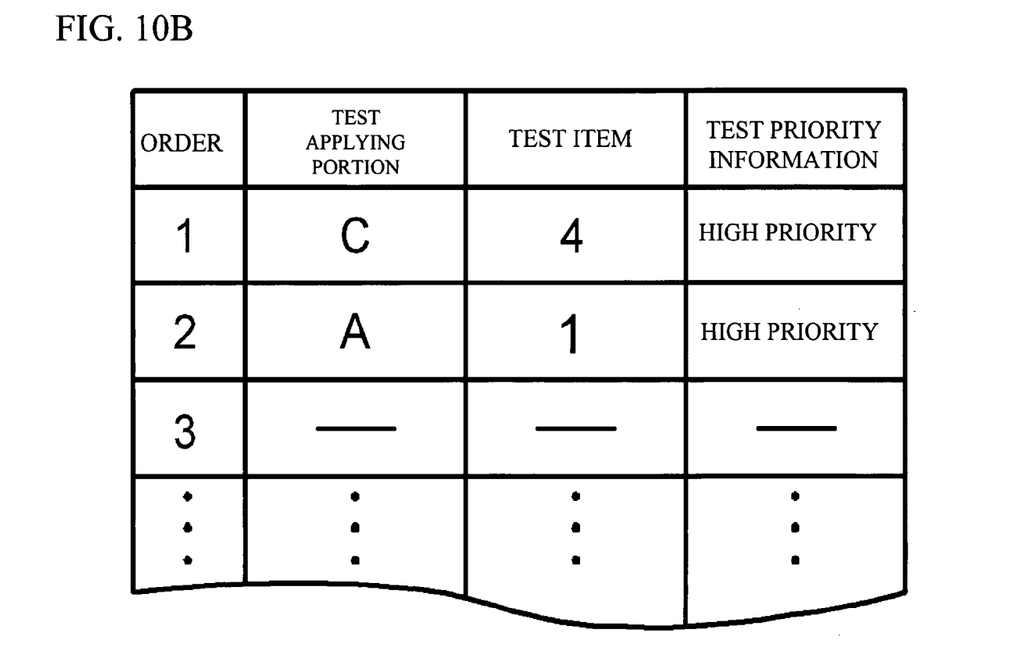

FIG. 10A and FIG. 10B are examples in which the test order information includes test priority information. FIG. 10A and FIG. 10B are views showing the test order information of the testing portion 20b. In addition to the content of the test order information, the test priority information is included to correspond to the test item of each test order. The test priority information includes two or more priority levels. In the first exemplary embodiment, two priorities of high priority and normal are included. At step S20 of FIG. 4, when the first controller 11 in the test applying portion 10a gives an instruction of the test to the testing portion 20b, the test priority information of the test items is simultaneously output. For example, when the test priority information is a high priority and the previous test item (test item 4 of the test applying portion 10c) has the priority information of normal (lower in priority), the second controller 22 in the testing portion 20b sets the test order of the test item 4 in the test applying portion 10a to earlier, according to the previous test item, as shown in FIG. 10A. That is, the priority is given to the test item 4 of the test in the test applying portion 10a. Meanwhile, when the test priority information of the previous test item is a high priority (the priority is same or higher) as shown in FIG. 10B, the priority is given to the previous test item.

As stated, the first controller 11 is capable of giving the priority to the test order thereof in the test order information of the testing portion 20b. In addition, the first controller 11 is also capable of selecting the selected testing portion on the basis of the test priority information at step S18 of FIG. 4. Furthermore, in the first exemplary embodiment, the switch portion 30 includes: the first switch 32; the second switch 34; and the connecting portion 36. However, the switch portion 30 may arbitrarily connect one of the multiple transmission paths LA, LB, and LC with one of the transmission paths La, Lb, and Lc.

Second Exemplary Embodiment

Figure 11:
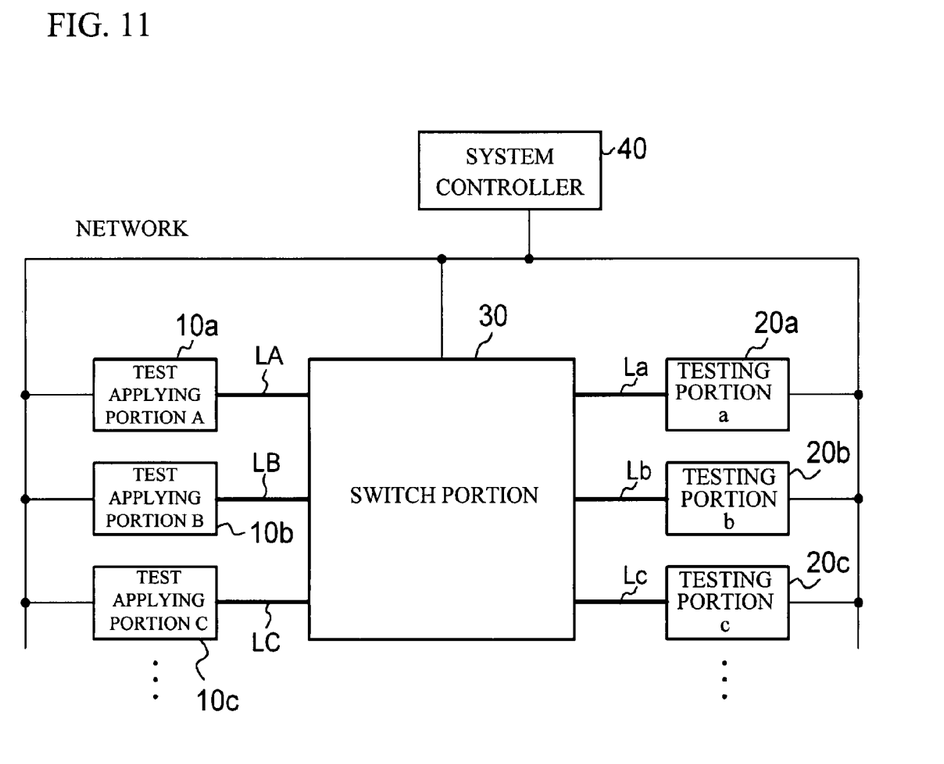
FIG. 11 shows a system configuration of the testing system in accordance with a second exemplary embodiment of the present invention.

A second exemplary embodiment is an example where a system controller 40 is included. Referring to FIG. 11, the testing system includes the system controller 40 connected to the test applying portions 10 and the testing portions 20. The system controller is made up, for example, of a personal computer, and is connected to a network such as a LAN or the like, which is also connected by the test applying portions 10, the testing portions 20, the switch portion 30, and the like. In the second exemplary embodiment, the same components and configurations as those employed in the first exemplary embodiment have the same reference numerals and a detailed explanation will be omitted. In the testing system employed in the second exemplary embodiment, the system controller 40 retains test item information. The testing system employed in the second exemplary embodiment is controlled as described below. At step S10 of FIG. 4, the first controller 11 outputs a test item request to the system controller 40, so as to obtain the test item information. At step S12, the first controller 11 obtains the test item information as to the testing portions 20 from the system controller 40. In this manner, the test item information may be provided from the testing portions 20 as in the first embodiment, or may be provided from the system controller 40 as in the second embodiment. The system controller 40 also holds the order information and the recognition information as to the testing portions 20. At step S16, the first controller 11 obtains the order information and the recognition information as to the testing portions 20 from the system controller 40. At step S20, the first controller 11 sends an instruction to carry out a test directly to the selected testing portions 20b or sends such an instruction to the selected testing portion 20b via the system controller 40. At step S21, the first controller 11 obtains a notification as to the possibility of a test directly from the selected testing portion 20b or obtains such a notification via the system controller 40. At step S22, the first controller 11 sends an instruction for the switch portion 30 directly to the selected testing portion 20b or sends such an instruction via the system controller 40. At step S28, the first controller 11 obtains the test data directly from the selected testing portion 20b or obtains the test data via the system controller 40. At step S30, the first controller 11 sends the end notification directly to the selected testing portion 20b or sends the end notification via the system controller 40. The other aspects of the control operation in this embodiment are the same as those in the first embodiment, and therefore, explanation of them is omitted herein. In this manner, the information acquirement, the instruction, and the notification via the system controller 40 can achieve the same effects as those of the first embodiment. Also, as shown in FIGS. 10A and 10B, the first controller 11 can put priority on the test items on which tests are to be carried out in accordance with the order information as to the testing portion 20b.

In the first and second exemplary embodiments, the tested signal may be an electrical signal, optical signal, or the like. In particular, when an optical signal is used, the loss is small and the noise-resistance characteristics are excellent in the transmission of a long distance over the optical fiber. Even if the test applying portion 10 and the testing portion 20 are physically apart in the distance, it is possible to use the testing system employed in the first exemplary embodiment. It is therefore possible to use the testing portion 20 in a more effective manner. Here, if the optical fiber is employed and the wavelength of the optical signal, which is a tested signal, ranges from 1.3 µm to 1.5 µm, the loss due to the transmission of the optical signal can be further reduced. Also, the test device or element may be any other thing than the semiconductor laser, and may be a light emitting element that outputs an optical signal such as a light emitting diode. The signal outputting portion of the test applying portion 10 may be any one of the power supply 13, the signal generator 12, and the temperature controller 14, or may be any other apparatus that causes the test device or element to output the tested signal. It is only necessary for the tester 24 of the testing portion 20 to perform a test on the tested signal output from the test device or element. Two or more testers 24 may be used together.

If the tested signal is an electrical signal, the test device or element is possibly, for example, an electronic device that outputs an analogue or digital signal as an electrical signal. The signal outputting portion of the test applying portion 10 may be, for example, the signal generator 12, the power supply 13, or the temperature controller 14, each of which causes the electrical device to output an electrical signal. The branching portion 38 may branch the electrical signal, and the transmission path may be an electrical cable.

Third Exemplary Embodiment

Figure 12:
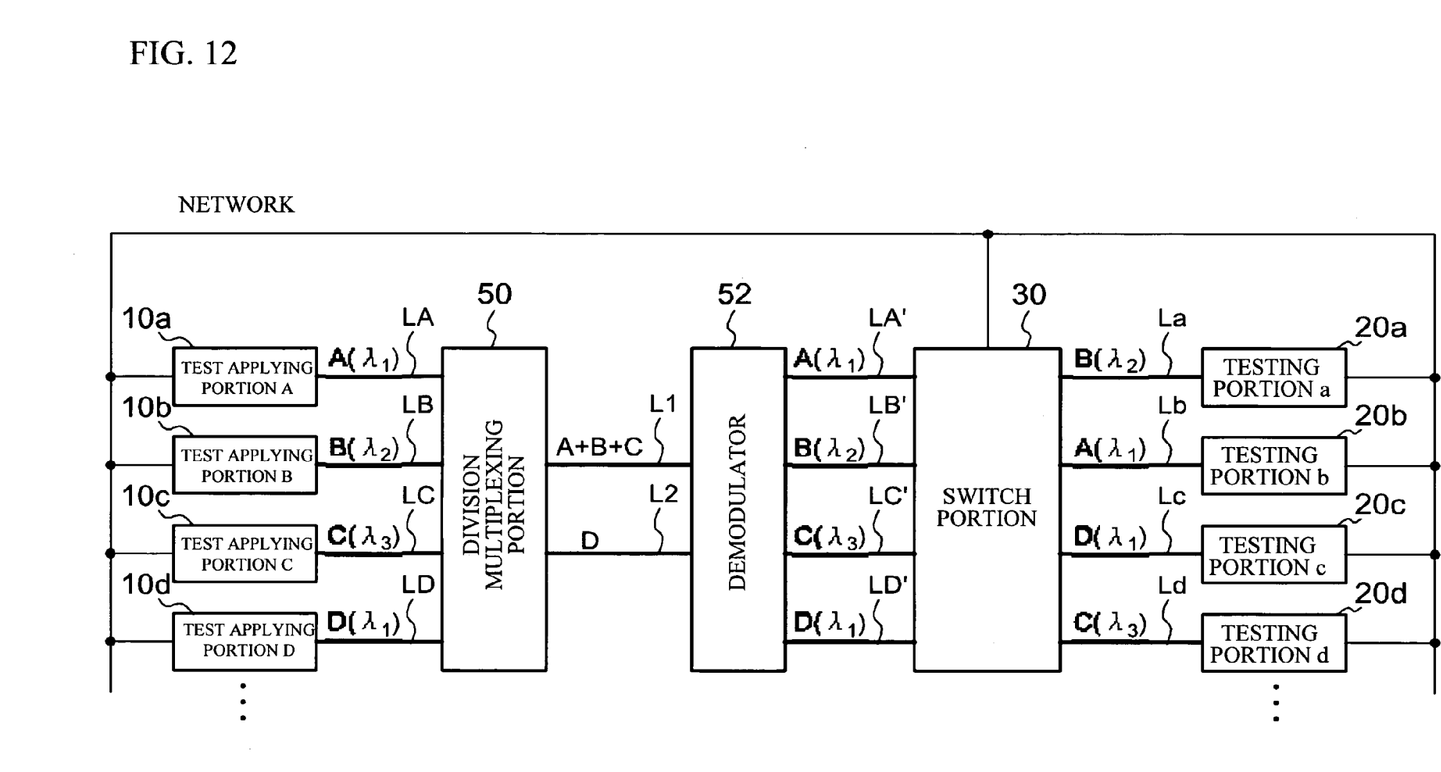
FIG. 12 shows a system configuration of the testing system in accordance with a third exemplary embodiment of the present invention.

A description will be given of a third exemplary embodiment, in which an optical signal is used as the tested signal and division multiplexing is applied to the transmission of the optical signal from the test device or element to the switch portion 30. Referring to FIG. 12, a division multiplexing portion 50 and a demodulator 52 are connected between the test applying portions 10 and the switch portion 30. In the third exemplary embodiment, the same components and configurations as those employed in the first exemplary embodiment have the same reference numerals and a detailed explanation will be omitted. For example, an optical signal $A(\lambda 1)$ of a wavelength $\lambda 1$ is output to an optical fiber LA from the semiconductor laser in the test applying portion 10a. In a similar manner, for example, optical signals $B(\lambda 2)$, $C(\lambda 3)$, and $D(\lambda 1)$ are respectively output to optical fibers LB, LC, and LD, respectively from the test applying portions 10b, 10c, and 10d. Here, $\lambda 1$, $\lambda 2$, and $\lambda 3$ have different wavelengths. The division multiplexing portion 50 division multiplexes the optical signals of different wavelengths, and outputs to transmission paths L1 and L2. The optical signals $A(\lambda 1)$, $B(\lambda 2)$, and $C(\lambda 3)$ are division multiplexed and output to the transmission path L1. Since the optical signals $D(\lambda 1)$ and $A(\lambda 1)$ have the same wavelength, the optical signal $D(\lambda 1)$ is output to the different transmission path L2 from the optical signal $A(\lambda 1)$. The demodulator 52 respectively demodulates the optical signal that has been division multiplexed, and respectively causes the optical signals $A(\lambda 1)$, $B(\lambda 2)$, $C(\lambda 3)$, and $D(\lambda 1)$ to be output to optical fibers LA', LB', LC', and LD'. The switch portion 30, which is an optical switch, arbitrarily connects the optical fibers LA', LB', LC', and LD' with optical fibers La, Lb, Lc, and Ld. In the example of FIG. 12, the optical fiber La is connected to the optical fiber LB'. In a similar manner, the optical fibers Lb, Lc, and Ld are respectively connected to the optical fibers LA', LC', and LD'.

In the third exemplary embodiment, there are provided: the division multiplexing portion 50 that division multiplexes the optical signals having different wavelengths output from multiple test devices or elements; the optical fibers L1 and L2 (transmitting portion) that transmit such division multiplexed optical signals; and the demodulator that demodulates the transmitted optical signals and outputs to the switch portion 30. This makes it possible to reduce the number of the optical fibers to transmit the optical signals between the test applying potion 10 and the switch portion 30. In particular, it is effective that the test applying portion 10 and the switch portion 30 are apart.

The test applying portion 10, the testing portion 20 and the switch portion 30 may be controlled in a similar manner as described in the first exemplary embodiment. Also, the system controller 40 employed in the second exemplary embodiment may be added and controlled in a similar manner as described in the second exemplary embodiment. The description has been given of the three test applying portions 10a(A) through 10c(C) and three testing portions 20a(a) through 20c(c). However, the present invention may employ an arbitrary number of the test applying portions 10 and that of the testing portions 20.

Finally, various aspects of the present invention are summarized in the following.

There is provided a testing system including: a plurality of test applying portion that operate a test device to make an output signal from the test device; a plurality of testing portions that test the output of the test device; and a switch portion that switches the output signal between the test applying portions and the testing portions, the test applying portion having a selecting portion that selects the testing portion for testing the output signal through the switch portion under test item information, the test item information including information about a test capability of the testing portion.

In the above-described testing system, the test item information may be supplied from the testing portions or a system controller that holds the test item information.

In the above-described testing system, the selecting portion may output a test item request to the testing portions or the system controller, so as to obtain the test item information, and in accordance with the test item request, the test item information as to the testing portions may be obtained from the testing portions or the system controller.

In the above-described testing system, the selecting portion may obtain order information indicating testing order in which the testing portions carry out tests, and, in accordance with the order information and the test item information as to the testing portions, the selecting portion may select the testing portion to be connected.

In the above-described testing system, the selecting portion can put priority on the selected testing portion in terms of the testing order.

In the above-described testing system, there may be further provided: a multi-branching portion that multi-divides optical signals that are the tested signals having different wavelengths that are output from the tested devices; a transmitting unit that transmits the multi-divided optical signals; and a demodulating unit that demodulates the transmitted optical signals and outputs the demodulated optical signals to the switch portion.

According to another aspect of the present invention, there is provided a test applying portion that operates a test device to make an output signal of the test deice including: a selecting portion that selects a testing portion for testing the output signal under test item information, the test item information including information about a test capability of the testing portion.

In the test applying portion, the selecting portion may output a test item request so as to obtain the test item information, and in accordance with the test item request, the test item information may be obtained.

In the test applying portion, the selecting portion may obtain order information indicating testing order in which the testing portions carry out tests, and, in accordance with the order information as to the testing portions and the test item information, the selecting portion may select the testing portion to be connected.

In the test applying portion, the selecting portion can put priority on the selected testing portion in terms of the testing order.

According to yet another aspect of the present invention, there is provided a testing system control method including: receiving test item information including information about a test capability of testing portions; and selecting the testing portions for testing an output signal of a test device.

The method may be configured so that the step of obtaining test item information includes outputting a test item request so as to obtain the test item information.

The method may be configured so that the step of selecting a testing portion includes obtaining order information indicating testing order in which the testing portions carry out tests, and selecting the testing portion to be connected, in accordance with the order information as to the testing portions and the test item information.

The method may be configured so that the step of selecting a testing unit includes putting priority on the selected testing unit in terms of the testing order in which the testing units carry out tests on the test items.

As described above, the present invention can provide a testing system to which a new test applying portion can be easily connected, and from which a test applying portion can be easily disconnected, without a change to the program or a stop of the entire system. The present invention can also provide a testing system control method, and testing apparatuses.

Although a few specific exemplary embodiments employed in the present invention have been shown and described, it would be appreciated by those skilled in the art that changes may be made in these exemplary embodiments without departing from the principles and spirit of the invention, the scope of which is defined in the claims and their equivalents.

The present invention is based on Japanese Patent Application No. 2006-101120 filed on Mar. 31, 2006, the entire disclosure of which is hereby incorporated by reference.

What is claimed is:

1. A testing system comprising:
a plurality of test applying portions, each test applying portion having a test device that generates an output signal in response to the test applying portion;
a plurality of testing portions, each testing portion that tests the output signal of the test device; and
a switch portion that switches the output signal of the test device between the test applying portions and the testing portions,
the test applying portion having a selecting portion that acquires from the testing portion for a test item information that indicates information about a test capability of the testing portion,
wherein when the testing portion has the test capability to perform a test for the test item information, the selecting portion sends request to the testing portion to test the output signal of the test device according to the test item information.

2. The testing system as claimed in claim 1, wherein the test item information is supplied from the testing portions or a system controller that holds the test item information.

3. The testing system as claimed in claim 2, wherein:
the selecting portion outputs a test item request to the testing portions or the system controller, to obtain the test item information; and
in accordance with the test item request, the test item information of the testing portions is obtained from the testing portions or the system controller.

4. The testing system as claimed in claim 1, wherein the selecting portion obtains order information indicating testing order in which the testing portions carry out tests, and, in accordance with the order information and the test item information of the testing portions, the selecting portion selects the testing portion to be connected.

5. The testing system as claimed in claim 4, wherein the selecting portion can put priority on the selected testing portion in terms of the testing order.

6. The testing system as claimed in claim 1, further comprising:
a multi-branching portion that multi-divides optical signals that are the tested signals having different wavelengths that are output from the tested devices;

a transmitting unit that transmits the multi-divided optical signals; and a demodulating unit that demodulates the transmitted optical signals and outputs the demodulated optical signals to the switch portion.

7. A test applying portion having a test device that generates an output signal in response to the test applying portion, comprising:

a selecting portion that acquires from a testing portion for a test item information, that indicates information about a test capability of the testing portion, wherein when the testing portion has the test capability to perform a test for the test item information, the selecting portion sends request to the testing portion to test the output signal of the test device according to the test item information.

8. The test applying portion as claimed in claim 7, wherein:

the selecting portion outputs a test item request to obtain the test item information; and in accordance with the test item request, the test item information is obtained.

9. The test applying portion as claimed in claim 7, wherein the selecting portion obtains order information indicating testing order in which the testing portions carry out tests, and, in accordance with the order information of the testing portions and the test item information, the selecting portion sends request to select the testing portion to be connected.

10. The test applying portion as claimed in claim 9, wherein the selecting portion can put priority on the selected testing portion in terms of the testing order.

11. A testing system control method comprising:

receiving test item information including information about a test capability of testing portions; and selecting the testing portions for testing an output signal of a test device.

12. The method as claimed in claim 11, wherein the step of obtaining test item information includes outputting a test item request to obtain the test item information.

13. The method as claimed in claim 11, wherein the step of selecting a testing portion includes obtaining order information indicating testing order in which the testing portions carry out tests, and selecting the testing portion to be connected, in accordance with the order information of the testing portions and the test item information.

14. The method as claimed in claim 13, wherein the step of selecting a testing unit includes putting priority on the selected testing unit in terms of the testing order in which the testing units carry out tests on the test items.

* * * * *